US012660508B2

(12) United States Patent
Wang

(10) Patent No.: US 12,660,508 B2
(45) Date of Patent: Jun. 16, 2026

(54) MAGNETORESISTIVE RANDOM ACCESS MEMORY

(71) Applicant: UNITED MICROELECTRONICS CORP., Hsin-Chu City (TW)

(72) Inventor: Hui-Lin Wang, Taipei City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 637 days.

(21) Appl. No.: 17/878,082

(22) Filed: Aug. 1, 2022

(65) Prior Publication Data

US 2024/0008369 A1    Jan. 4, 2024

(30) Foreign Application Priority Data

Jun. 29, 2022    (TW) .................................. 111124237

(51) Int. Cl.
*H10N 50/10* (2023.01)
*H10B 61/00* (2023.01)
*H10N 50/80* (2023.01)
*H10N 50/85* (2023.01)

(52) U.S. Cl.
CPC ............. *H10N 50/10* (2023.02); *H10B 61/22* (2023.02); *H10N 50/80* (2023.02); *H10N 50/85* (2023.02)

(58) Field of Classification Search
CPC ................................ H10N 50/10; H10B 61/00
See application file for complete search history.

(56) References Cited

U.S. PATENT DOCUMENTS

| | | | | |
|---|---|---|---|---|
| 2017/0140784 A1* | 5/2017 | Sukegawa | ................ | G11B 5/66 |
| 2019/0355897 A1 | 11/2019 | Sun | | |
| 2020/0052191 A1 | 2/2020 | Ma | | |
| 2021/0351346 A1* | 11/2021 | Lin | ........................ | H10B 61/00 |
| 2022/0115586 A1* | 4/2022 | Lee | ........................ | H10N 50/10 |
| 2023/0172073 A1* | 6/2023 | Dutta | ..................... | H10N 50/10 |
| | | | | 257/421 |
| 2024/0365682 A1* | 10/2024 | Chuang | .................. | H10N 50/10 |

FOREIGN PATENT DOCUMENTS

| | | |
|---|---|---|
| CN | 109155360 A | 1/2019 |
| CN | 112928203 A | 6/2021 |
| TW | 201936488 A | 9/2019 |
| TW | 202105385 A | 2/2021 |
| TW | 202218206 A | 5/2022 |

* cited by examiner

*Primary Examiner* — Chad M Dicke
*Assistant Examiner* — Jeremy Daniel Watts
(74) *Attorney, Agent, or Firm* — Winston Hsu

(57) ABSTRACT

A semiconductor device includes a bottom electrode on a substrate, a magnetic tunneling junction (MTJ) on the bottom electrode, a first cap layer on the MTJ, a second cap layer on the first cap layer, a block layer on the second cap layer, and a top electrode on the block layer. Preferably, the block layer could be made of Co-based alloy or metal nitride, in which the Co-based alloy could further include CoW alloy whereas the metal nitride could include WN.

8 Claims, 4 Drawing Sheets

MAGNETORESISTIVE RANDOM ACCESS MEMORY

BACKGROUND OF THE INVENTION

1. Field of the Invention

The invention relates to a semiconductor device, and more particularly to a magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a semiconductor device includes a bottom electrode on a substrate, a magnetic tunneling junction (MTJ) on the bottom electrode, a first cap layer on the MTJ, a second cap layer on the first cap layer, a block layer on the second cap layer, and a top electrode on the block layer. Preferably, the block layer could be made of Co-based alloy or metal nitride, in which the Co-based alloy could further include CoW alloy whereas the metal nitride could include WN.

According to another aspect of the present invention, a semiconductor device includes a bottom electrode on a substrate, a magnetic tunneling junction (MTJ) on the bottom electrode, a high entropy layer on the MTJ, and a top electrode on the high entropy layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
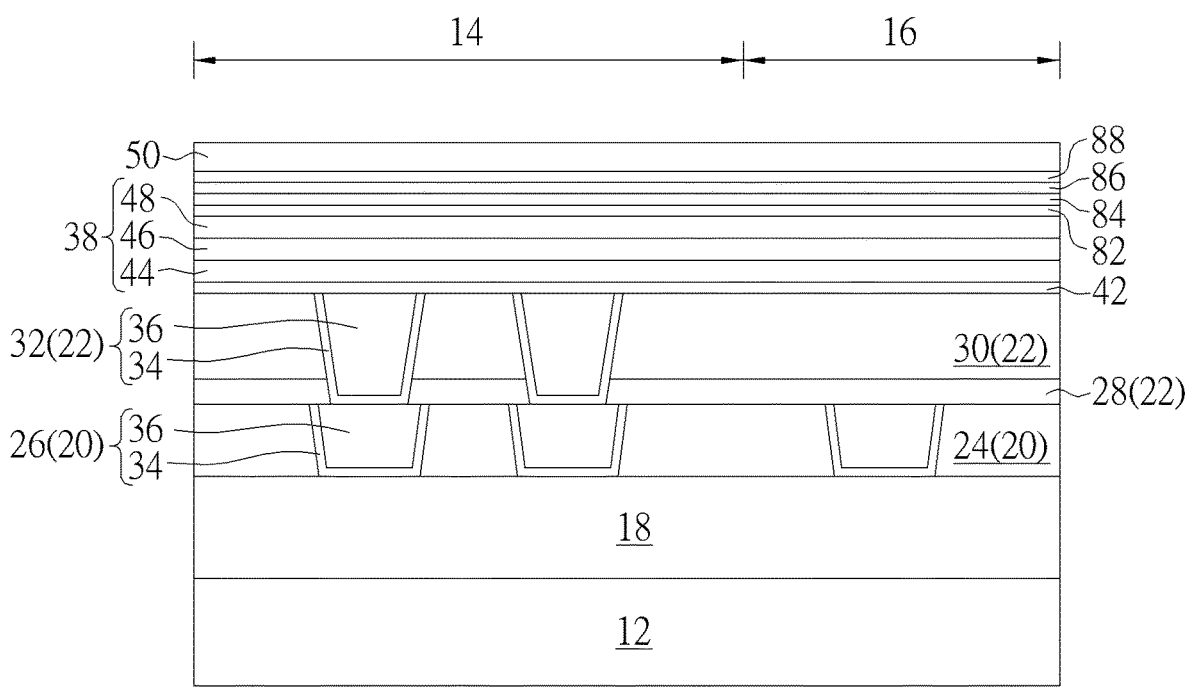
FIGS. 1-4 illustrate a method for fabricating a MRAM device according to an embodiment of the present invention.

Referring to FIGS. 1-4, FIGS. 1-4 illustrate a method for fabricating a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MRAM region 14 and the logic region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 26 are preferably made of copper, the metal layer 36 in the metal interconnections 32 are made of tungsten, the IMD layers 24, 30 are preferably made of silicon oxide such as tetraethyl orthosilicate (TEOS), and the stop layer 28 is preferably made of nitrogen doped carbide (NDC), silicon nitride, silicon carbon nitride (SiCN), or combination thereof.

Next, a bottom electrode 42, a MTJ stack 38 or stack structure, a cap layer 82, a cap layer 84, a block layer 86, a cap layer 88, a top electrode 50, and a patterned mask (not shown) are formed on the metal interconnect structure 22. In this embodiment, the formation of the MTJ stack 38 could be accomplished by sequentially depositing a pinned layer 44, a barrier layer 46, and a free layer 48 on the bottom electrode 42. In this embodiment, the bottom electrode 42 and the top electrode 50 are preferably made of conductive material including but not limited to for example Ta, TaN, Pt, Cu, Au, Al, Ru, or combination thereof and more specifically in this embodiment, the bottom electrode 42 is made of TaN while the top electrode of ruthenium (Ru). The pinned layer 44 could be made of ferromagnetic material including but not limited to for example iron, cobalt, nickel, or alloys thereof such as cobalt-iron-boron (CoFeB) or cobalt-iron (CoFe). Alternatively, the pinned layer 44 could also be made of antiferromagnetic (AFM) material including but not limited to for example ferromanganese (FeMn), platinum manganese (PtMn), iridium manganese (IrMn), nickel oxide (NiO), or combination thereof, in which the pinned layer 44 is formed to fix or limit the direction of magnetic moment of adjacent layers. The barrier layer 46 could be made of insulating material including but not limited to for example oxides such as aluminum oxide ($AlO_x$) or magnesium oxide (MgO). The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field.

In this embodiment, the cap layer 82 disposed on top of the MTJ stack 28 preferably includes metal oxide such as MgO, the cap layer 84 and the top electrode 50 preferably include same material or same metal such as Ru, the block layer 86 preferably includes cobalt-based (Co-based) alloy or metal nitride, and the cap layer 88 preferably includes metal such as Ta. If the block layer 86 were made of Co-based alloy, an example of the block layer 86 would include but not limited to for example CoW alloy, whereas if the block layer 86 were made of metal nitride, an example of the block layer 86 would include but not limited to for example tungsten nitride (WN).

Moreover, the thickness of the cap layer 84 is approximately 10 Angstroms, the thickness of the block layer 86 is between 5-20 Angstroms, the thickness of the cap layer 88 is between 10-20 Angstroms, and the thickness of the top electrode 50 is between 65-75 Angstroms or most preferably 70 Angstroms. By forming a block layer 86 between the cap layer 84 made of Ru and the cap layer 88 made of Ta, it would be desirable to stop or prevent diffusion of Ta atoms from the cap layer 88 into the lower MTJ stack 38 thereby affecting the performance of the MTJ afterwards.

Figure 2:
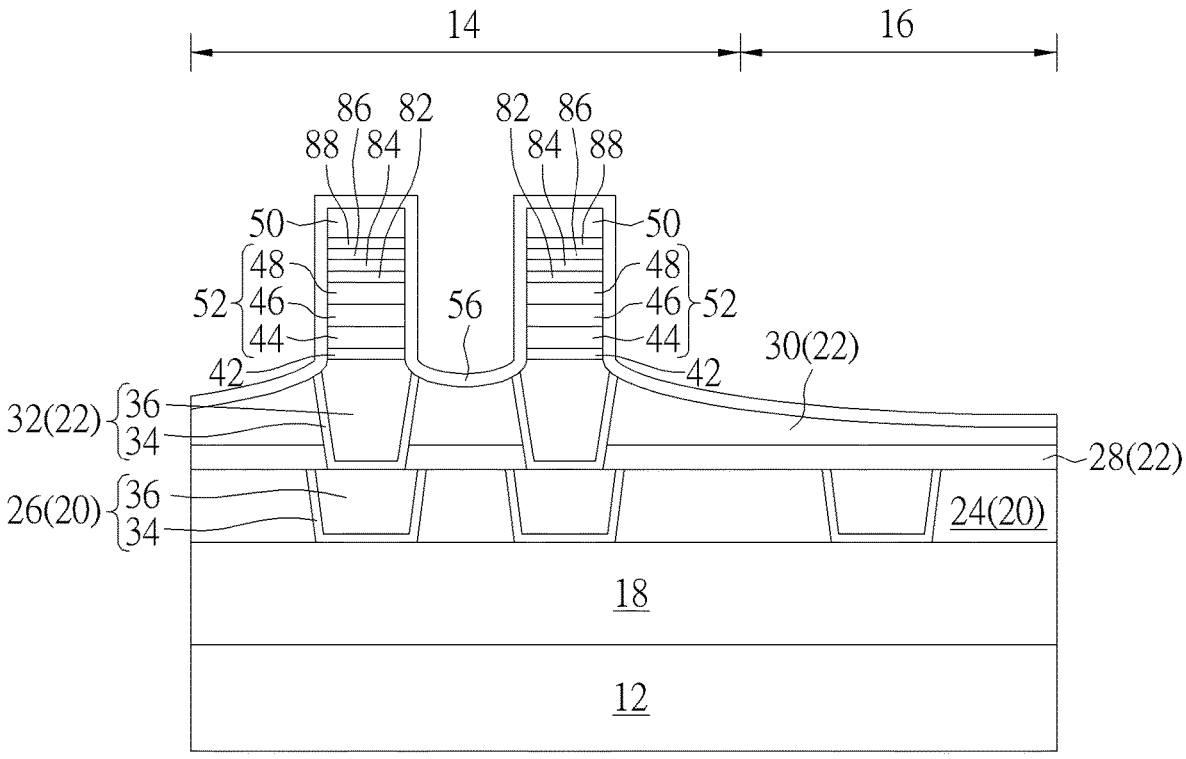

Next, as shown in FIG. 2, one or more etching process is conducted by using the patterned mask as mask to remove part of the top electrode 50, part of the cap layer 88, part of the block layer 86, part of the cap layer 84, part of the cap layer 82, part of the MTJ stack 38, part of the bottom electrode 42, and part of the IMD layer 30 to form MTJs 52 on the MRAM region 14. It should be noted that a reactive ion etching (ME) and/or an ion beam etching (IBE) process is conducted to remove the top electrode 50, cap layers 88, block layer 86, cap layers 84, 82, MTJ stack 38, bottom electrode 42, and the IMD layer 38 in this embodiment for forming the MTJs 52. Due to the characteristics of the IBE process, the top surface of the remaining IMD layer 30 is slightly lower than the top surface of the metal interconnections 32 after the IBE process and the top surface of the IMD layer 30 also reveals a curve or an arc. It should also be noted that as the IBE process is conducted to remove part of the IMD layer 30, part of the metal interconnection 32 is removed at the same time to form inclined sidewalls on the surface of the metal interconnection 32 immediately adjacent to the MTJs 52.

Next, a cap layer 56 is formed on the MTJs 52 while covering the surface of the IMD layer 30. In this embodiment, the cap layer 56 preferably includes silicon nitride, but could also include other dielectric material including but not limited to for example silicon oxide, silicon oxynitride (SiON), or silicon carbon nitride (SiCN).

Figure 3:
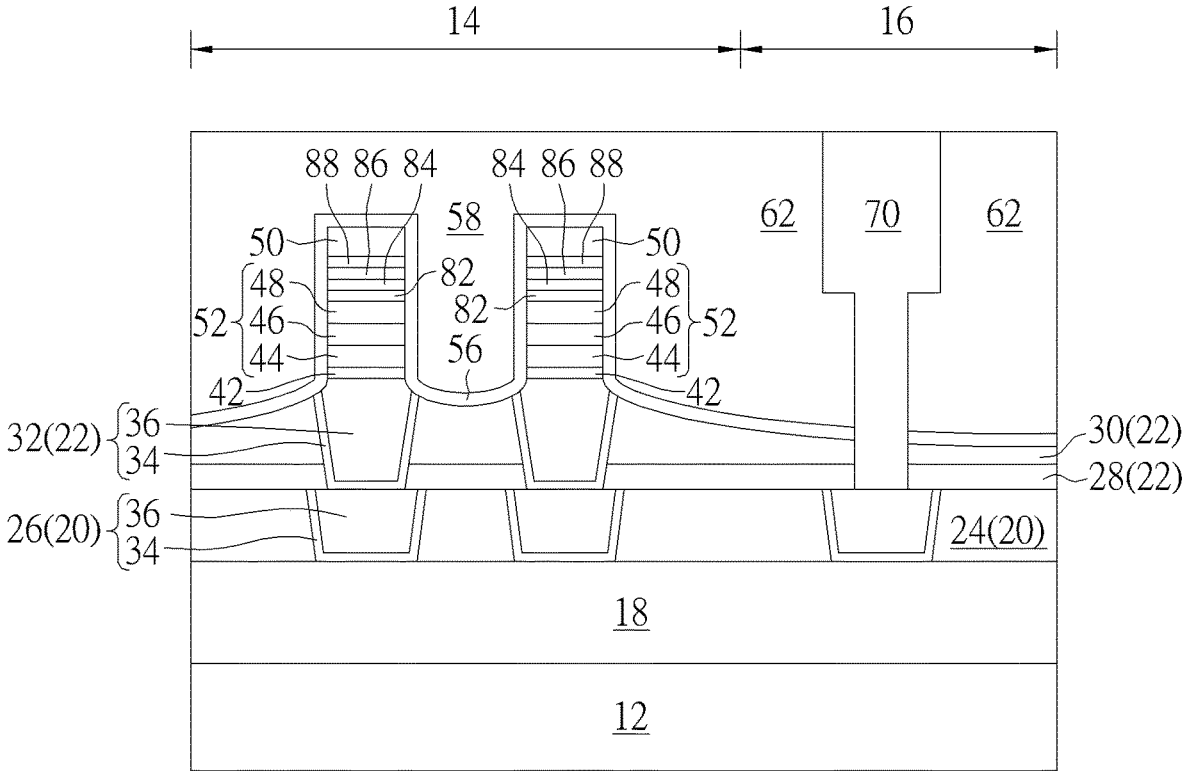

Next, as shown in FIG. 3, a flowable chemical vapor deposition (FCVD) process is conducted to form an inter-metal dielectric (IMD) layer 62 on the passivation layer 58. In this embodiment, the IMD layer 62 preferably include an ultra low-k (ULK) dielectric layer including but not limited to for example porous material or silicon oxycarbide (SiOC) or carbon doped silicon oxide (SiOCH).

Next, a pattern transfer process is conducted by using a patterned mask (not shown) to remove part of the IMD layer 62, part of the cap layer 56, part of the IMD layer 30, and part of the stop layer 28 on the logic region 16 to form a contact hole (not shown) exposing the metal interconnection 26 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact hole, and a planarizing process such as CMP could be conducted to remove part of the conductive materials including the aforementioned barrier layer and metal layer to form a metal interconnection 70 in the contact hole electrically connecting the metal interconnection 26.

Figure 4:
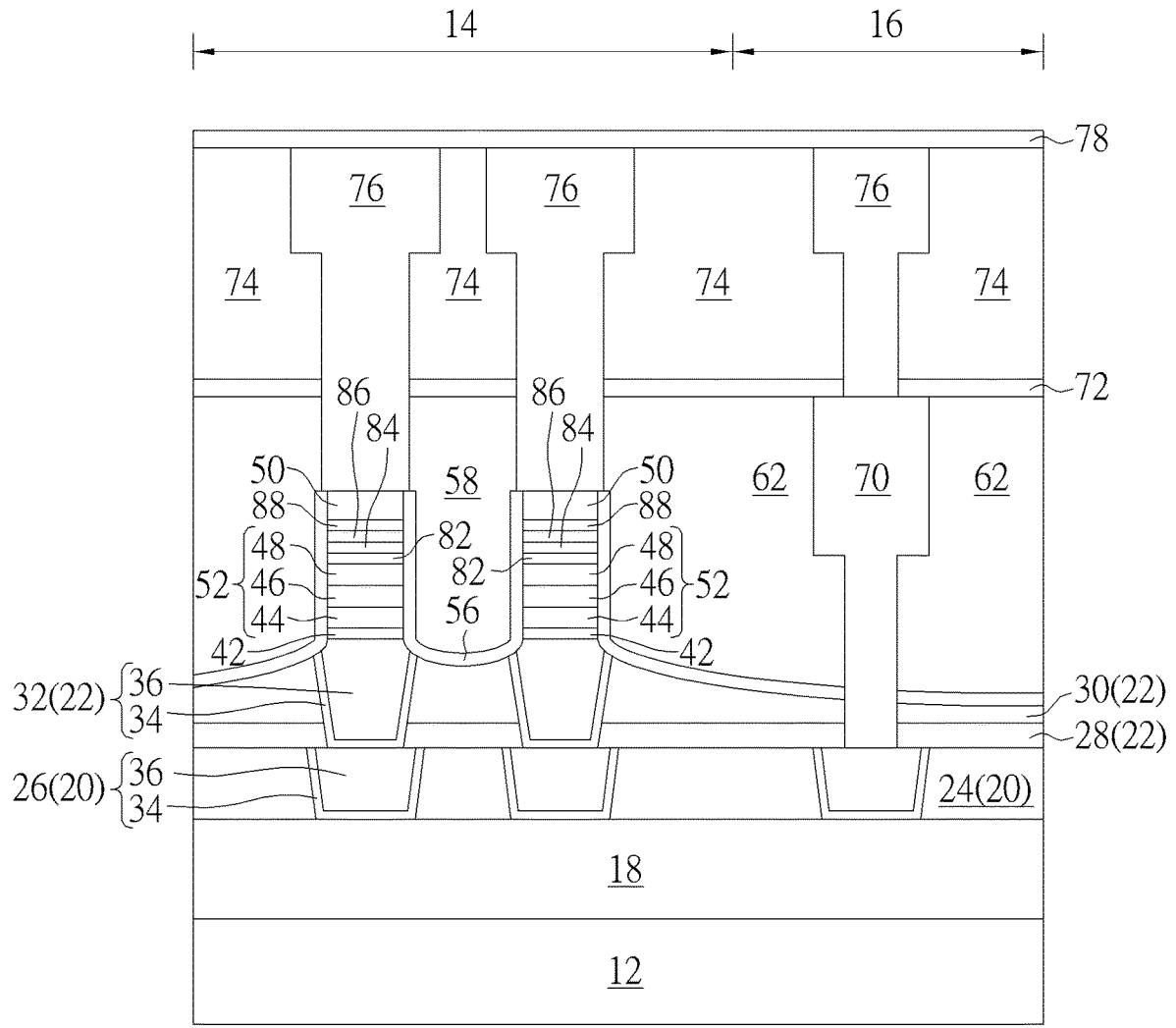

Next, as shown in FIG. 4, a stop layer 72 is formed on the MRAM region 14 and logic region 16 to cover the IMD layer 62 and metal interconnection 70, an IMD layer 74 is formed on the stop layer 72, and one or more photo-etching process is conducted to remove part of the IMD layer 74, part of the stop layer 72, part of the IMD layer 62, part of the passivation layer 58, and part of the cap layer 56 on the MRAM region 14 and logic region 16 to form contact holes (not shown). Next, conductive materials are deposited into each of the contact holes and a planarizing process such as CMP is conducted to form metal interconnections 76 connecting the MTJs 52 and metal interconnection 70 underneath, in which the metal interconnections 76 on the MRAM region 14 directly contacts the top electrodes 50 underneath while the metal interconnection 76 on the logic region 16 directly contacts the metal interconnection 70 on the lower level. Next, another stop layer 78 is formed on the IMD layer 74 to cover the metal interconnections 76.

In this embodiment, the stop layers 72 and 78 could be made of same or different materials, in which the two layers 72, 78 could all include nitrogen doped carbide (NDC), silicon nitride, silicon carbon nitride (SiCN), or combination thereof. Similar to the metal interconnections formed previously, each of the metal interconnections 76 could be formed in the IMD layer 74 through a single damascene or dual damascene process. For instance, each of the metal interconnections 76 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Figure 5:
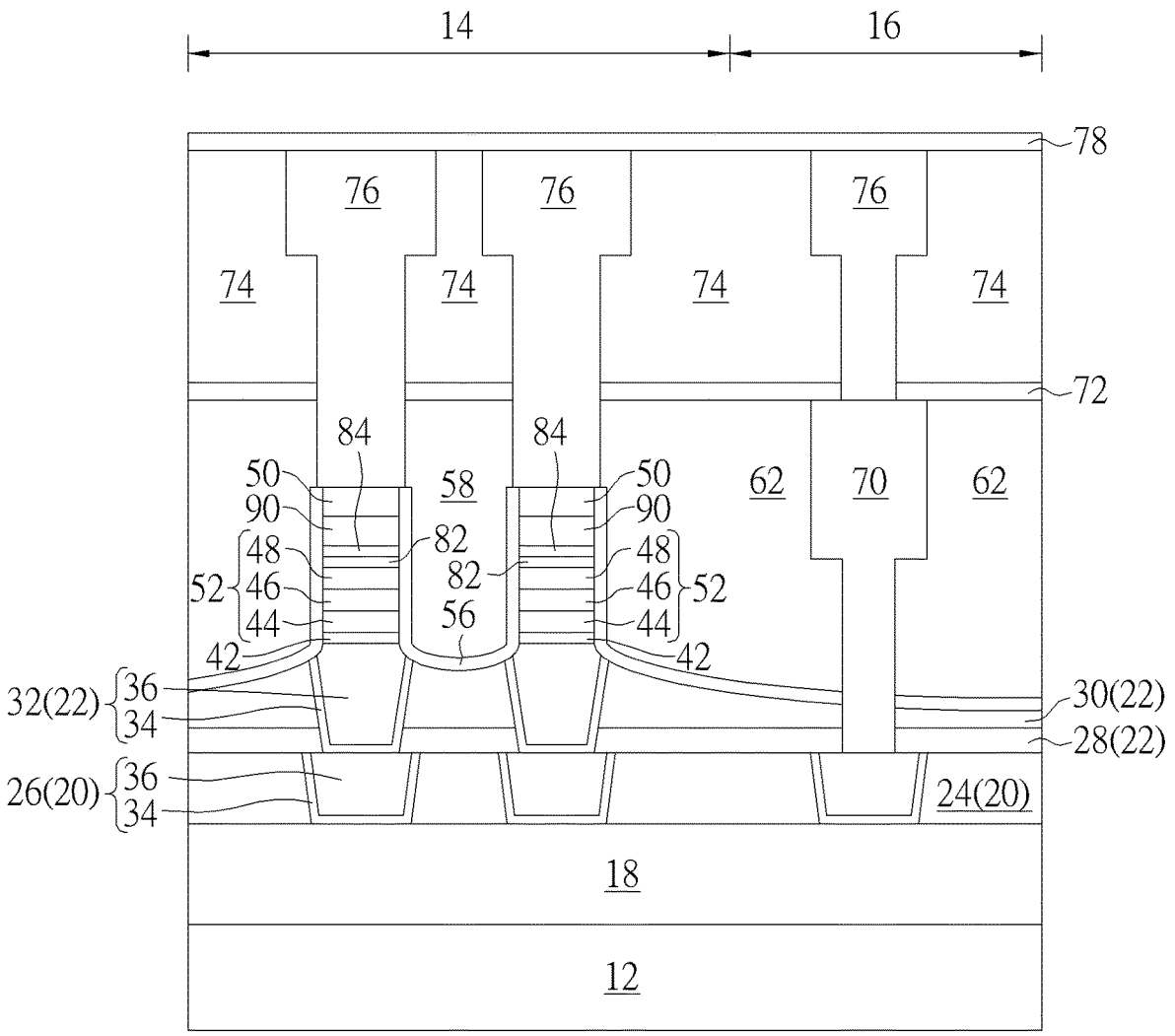
FIG. 5 illustrates a structural view of a MRAM device according to an embodiment of the present invention.

Referring to FIG. 5, FIG. 5 further illustrates a structural view of a MRAM device according to an embodiment of the present invention. As shown in FIG. 5, the MRAM device includes a bottom electrode 42 disposed on the substrate 12, a MTJ 52 disposed on the bottom electrode 42, a cap layer 82 disposed on the MTJ, a cap layer 84 disposed on the cap layer 82, a high entropy layer 90 disposed on the cap layer 84, and a top electrode 50 disposed on the high entropy layer 90.

In this embodiment, the cap layer 82 disposed on the top surface of the MTJ 52 preferably includes metal oxide such as MgO, the cap layer 84 preferably includes metal such as Ru, the top electrode 50 includes Ru, and the high entropy layer 90 preferably includes manganese (Mn), zinc (Zn), molybdenum (Mo), tungsten (W), osmium (Os), or combination thereof. Structurally, the thickness of the high entropy layer 90 is approximately 5-10 times the thickness of the cap layer 84 underneath and slightly less than or greater than the thickness of the top electrode 50 on the top. For instance, the thickness of the cap layer 84 is 10 Angstroms, the thickness of the top electrode 50 is between 65-75 Angstroms or most preferably 70 Angstroms, and the thickness of the high entropy layer 90 is between 50-100 Angstroms. It should be noted that in contrast to using the block layer 86 for preventing Ta atoms from diffusing into the MTJ 52 downward as disclosed in the aforementioned embodiment, the present embodiment forms a layer made of high entropy metal between the cap layer 84 and top electrode 50 both made of Ru in replace of the cap layer 88 made of Ta. Preferably, characteristics such as high melting point and high thermal stability of the high entropy layer 90 could be used to improve bonding between the high entropy layer 90 and the Ru metal layers, which then further prevents Ta or Ru atoms from diffusing downward into the MTJ and affecting magnetic performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a bottom electrode on a substrate;
   a magnetic tunneling junction (MTJ) on the bottom electrode;
   a first cap layer on the MTJ;
   a second cap layer directly on the first cap layer;
   a block layer directly on the second cap layer;
   a metal layer directly on the block layer; and
   a top electrode on the block layer.

2. The semiconductor device of claim 1, wherein the first cap layer comprises a metal oxide.

3. The semiconductor device of claim 1, wherein the second cap layer comprises a metal.

4. The semiconductor device of claim 3, wherein the second cap layer comprises ruthenium (Ru).

5. The semiconductor device of claim 1, wherein the second cap layer and the top electrode comprise a same material.

6. The semiconductor device of claim 1, wherein a thickness of the second cap layer is less than a thickness of the top electrode.

7. The semiconductor device of claim 1, wherein the block layer comprises a Co-based alloy.

8. The semiconductor device of claim 1, wherein the block layer comprises metal nitride.

* * * * *